United States Patent
Ribeiro et al.

(10) Patent No.: US 9,299,746 B2
(45) Date of Patent: Mar. 29, 2016

(54) SELECT DEVICE FOR CROSS POINT MEMORY STRUCTURES

(75) Inventors: Gilberto M. Ribeiro, Palo Alto, CA (US); Janice H. Nickel, Sunnyvale, CA (US)

(73) Assignee: Hewlett-Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/345,295

(22) PCT Filed: Oct. 12, 2011

(86) PCT No.: PCT/US2011/056006
§ 371 (c)(1),
(2), (4) Date: Mar. 17, 2014

(87) PCT Pub. No.: WO2013/055332
PCT Pub. Date: Apr. 18, 2013

(65) Prior Publication Data
US 2014/0313816 A1  Oct. 23, 2014

(51) Int. Cl.
*G11C 13/00* (2006.01)
*H01L 27/24* (2006.01)
(Continued)

(52) U.S. Cl.
CPC .......... *H01L 27/2463* (2013.01); *G11C 13/003* (2013.01); *G11C 13/0004* (2013.01); *G11C 13/004* (2013.01); *G11C 13/0007* (2013.01); *G11C 13/0011* (2013.01); *G11C 13/0069* (2013.01); *H01L 29/88* (2013.01); *H01L 45/16* (2013.01); *G11C 2213/33* (2013.01); *G11C 2213/72* (2013.01)

(58) Field of Classification Search
CPC ........... G11C 13/0002; G11C 13/0004; G11C 13/0007; G11C 13/0011; G11C 13/003; G11C 13/004; G11C 13/0069; G11C 2213/33; G11C 2213/72; H01L 27/2463; H01L 29/88; H01L 45/16
USPC ............................................ 365/148, 46, 175
See application file for complete search history.

(56) References Cited

U.S. PATENT DOCUMENTS 5,640,343 A * 6/1997 Gallagher .............. B82Y 10/00
257/E21.665
5,734,605 A  3/1998 Zhu et al.
(Continued)

FOREIGN PATENT DOCUMENTS

KR  20070050107  5/2007
KR  20070084213  8/2007

OTHER PUBLICATIONS

Chris Mellor, HP and Hynix to produce the memristor goods by 2013, Oct. 10, 2011, The Register.*
(Continued)

*Primary Examiner* — Vu Le
*Assistant Examiner* — Sung Cho
(74) *Attorney, Agent, or Firm* — International IP Law Group, PLLC

(57) ABSTRACT

The present disclosure provides a memory cell that includes a resistive memory element disposed between a first conductor and a second conductor, the first conductor and the second conductor configured to activate the resistive memory element. The memory cell also includes a backward diode disposed in series with the memory element between the memory element and either the first conductor or the second conductor.

8 Claims, 4 Drawing Sheets

(51) Int. Cl.
*H01L 29/88* (2006.01)
*H01L 45/00* (2006.01)

(56) References Cited

U.S. PATENT DOCUMENTS

| | | | |
|---|---|---|---|
| 5,818,749 A | 10/1998 | Harshfield | |
| 5,991,193 A * | 11/1999 | Gallagher | G11C 11/15 365/171 |
| 6,331,944 B1 * | 12/2001 | Monsma | G11C 11/15 365/158 |
| 6,504,779 B2 | 1/2003 | Perner | |
| 6,937,509 B2 | 8/2005 | Perner et al. | |
| 7,002,197 B2 | 2/2006 | Perner et al. | |
| 7,035,141 B1 * | 4/2006 | Tripsas | G11C 13/0002 257/E27.071 |
| 7,057,258 B2 | 6/2006 | Tran et al. | |
| 7,180,770 B2 | 2/2007 | Perner et al. | |
| 7,355,886 B1 | 4/2008 | Cai et al. | |
| 2004/0170040 A1 * | 9/2004 | Rinerson | G11C 13/0007 365/26 |
| 2006/0163629 A1 | 7/2006 | Nickel | |
| 2006/0215444 A1 | 9/2006 | Perner et al. | |
| 2008/0094929 A1 * | 4/2008 | Rinerson | G11C 13/004 365/208 |
| 2009/0273961 A1 * | 11/2009 | Ono | G11C 7/18 365/51 |
| 2011/0186801 A1 | 8/2011 | Yang et al. | |
| 2011/0240952 A1 | 10/2011 | Yang et al. | |
| 2011/0310652 A1 * | 12/2011 | Kim | G11C 13/0007 365/148 |
| 2012/0230080 A1 * | 9/2012 | Chang | G11C 11/5685 365/148 |

OTHER PUBLICATIONS

Hewlett-Packard Development Company, LP., International Search Report, May 17, 2012, Application No. PCT/US2011/056006, filed Oct. 12, 2011.

Wensheng Wei, Ningning Zhao, and Tianmin Wang, "Conduction Behaviour of Hydrogenated Nanocrystalline Silicon Backward Diode," Nanotechnology, vol. 18, Issue 2, Jan. 2007, Article 0252032007, pp. 1-5, doi:10.1088/0957-4484/18/2/025203.

Supplementary European Search Report, Feb. 27, 2015, European Patent Application No. 11874063.8, 4 pages.

* cited by examiner

100

200

300

400

SELECT DEVICE FOR CROSS POINT MEMORY STRUCTURES

STATEMENT REGARDING FEDERALLY SPONSORED RESEARCH OR DEVELOPMENT

This invention has been made with government support awarded by Defense Advanced Research Projects Agency. The government has certain rights in the invention.

BACKGROUND

A cross point memory array is an array of memory cells disposed between two sets of conductors running orthogonally above and below the memory cells. The first set of conductors, disposed below the memory cells for example, may be referred to as the word lines, while the second set of conductors, disposed above the memory cells, may be referred to as bit lines. Each memory cell in the cross point memory array is disposed at the cross point of a single word line and a single bit line. Selection of a single memory cell within the array for reading or writing the memory cell can be achieved by activating the word line and bit line associated with that memory cell. The reading of the selected memory cell may be achieved by applying a voltage to the word line and measuring the resulting current through the selected memory cell. During the reading of the selected memory cell, leakage currents, also known as parasitic currents or half-select currents, may be generated in the memory cells adjacent to the selected memory cell. The leakage current adds to the current through the selected memory cell, possibly resulting in incorrect results.

BRIEF DESCRIPTION OF THE DRAWINGS

Certain embodiments are described in the following detailed description and in reference to the drawings, in which.

DETAILED DESCRIPTION

Cross point memory arrays usually include a select device, such as a transistor, that prevents leakage currents through unselected memory cells from affecting the reading or writing of the selected memory cell. For example, a transistor can be disposed between word and bit lines in series with the memory cells to provide isolation by means of switching off the unselected device through a control gate. However, such a configuration consumes real estate within the memory array, thus reducing the density of memory cells within the array. In some memory arrays, the memory cells may be non-isolated devices. To reduce the effect of leakage currents in such a memory array, a multiple sampling technique may be used to read memory cells. However, additional architectural overhead is used to implement the multiple sampling technique. In some memory arrays, the memory cells may be configured to exhibit non-linear characteristics such that the memory element itself inhibits leakage currents.

In accordance with embodiments of the present techniques, each memory cell in the cross point array includes a backward diode disposed in series with the memory element between the word line and the bit line. The backward diode serves as a selection device by reducing the leakage current through the memory cells adjacent to the selected memory cell while allowing relatively large current to flow through the selected memory cell. Further, the backward diode allows current to flow through the memory cell in both the forward and reverse directions, which enables the bipolar memory cells to be written. By incorporating the selection device within each memory cell, the memory density of the memory array may be increased, and the additional circuit architecture used to implement a multiple sampling technique may be eliminated.

Using a backward diode allows relaxation of the non-linear requirement of the memristor or other memory element. This may be useful in other forms of memory that do not exhibit non-linear characteristics. Further, by placing the select device in series with the bit itself, the underlying silicon real estate may be made available for other devices such as decoders, switching matrices, sense and drive circuitry, and the like. The use of a backward diode also improves the achievable memory density eliminating the use of transistors to provide isolation between the memory cells.

Figure 1:
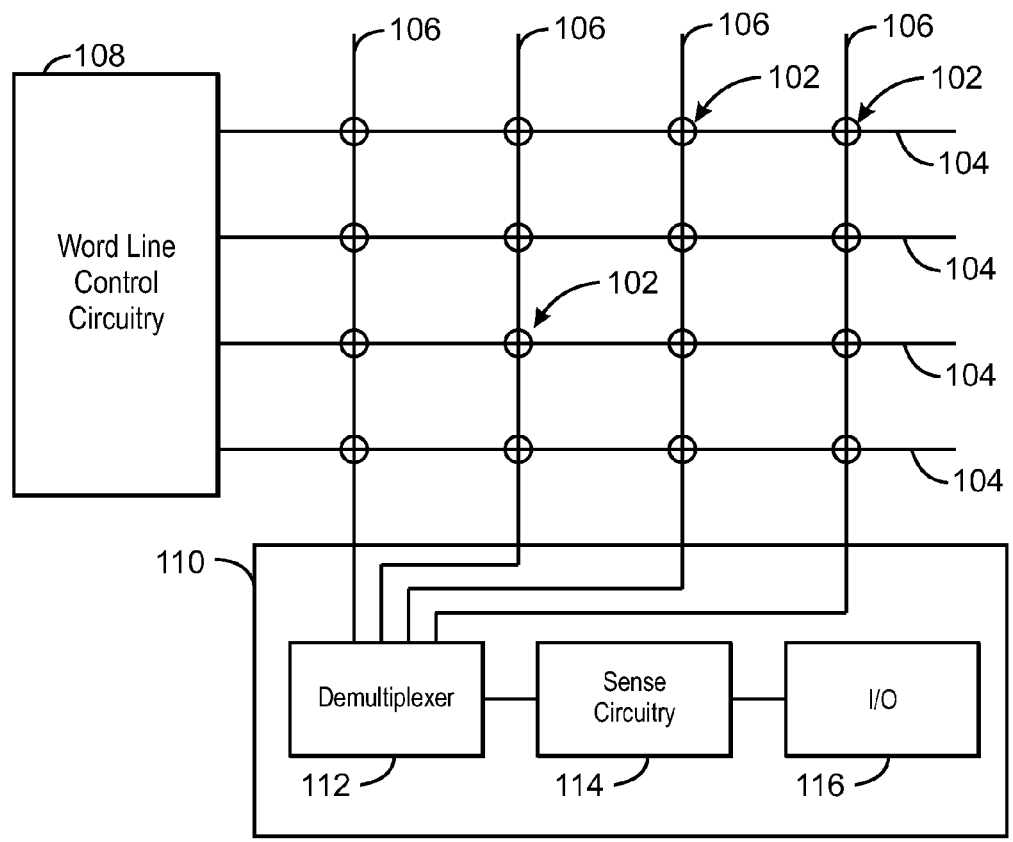
FIG. 1 is a block diagram of a data storage device in accordance with embodiments.

FIG. 1 is a block diagram of a data storage device in accordance with embodiments. As shown in FIG. 1, the data storage device 100 may include an array of memory cells 102 arranged in rows and columns. A set of conductive electrodes, referred to herein as word lines 104, extend over one side of the array of memory cells 102. Each word line 104 makes electrical contact with the memory cells 102 of a particular row. A set of conductive electrodes, referred to herein as bit lines 106, extend over the other side of the array of memory cells 102. Each bit line 106 makes electrical contact with the memory cells 102 of a particular column. Each memory cell 102 lies at the cross point of one word line 104 and one bit line 106. Each memory cell 102 may be selected for writing or reading, by activate the particular word line 104 and bit line 106 associated with that memory cell 102. As discussed further below in reference to FIG. 3, each memory cell 102 may include a memristor coupled in series with a backward diode.

The data storage device also includes word line control circuitry 108 coupled to the memory cells 102 through the respective word lines 104 and configured to activate a particular word line 104 for the reading or writing of a particular memory cell 102 associated with the word line 104. For example, the word line control circuitry 108 may include a multiplexer for selecting a particular one of the word lines 104. During the accessing of a particular memory cell for a read or write operation, the selected bit line and the unselected bit lines will be set to the same voltage by the word line control circuitry 108. The data storage device also includes bit line control circuitry 110 coupled to the memory cells 102 through the respective bit lines 106. The bit line control circuitry 110 may include a demultiplexer 112, sense circuitry 114, and an Input/Output (I/O) pad 116. The demultiplexer 112 may be configured to selectively couple the bit line 106 of the selected memory cell 102 to the sense circuitry 114. The word line control circuitry 108 and the bit line control circuitry 110 act in concert to access individual memory cells 102 by activating the corresponding word line 104 and bit line 106 coupled to the selected memory cell 102. It will be appreciated that the word line control circuitry 108 and the bit line control circuitry 110 described herein are examples of circuitry that may be used in an exemplary embodiment for accessing the memory cells 102. Other configurations known to those skilled in the art may be used for accessing the memory cells 102 in accordance with the present techniques.

During a write operation, the word line control circuitry 108 writes information to the selected memory cell 102 by applying a voltage to the specific word line 104 corresponding to the selected memory cell 102. The demultiplexer 112 of the bit line control circuitry 110 activates the selected memory cell 102 by coupling the memory cell 102 to ground. Current then flows through the selected memory cell 102, which affects the properties of the memory cell 102, in effect storing a logical one or logical zero to the memory cell 102. For example, if the memory element 300 included in the memory cell 102 is a memristor, the current flowing through the memristor changes the memristor's resistance. The change in the resistance can be detected during a subsequent read operation.

During a read operation, the word line control circuitry 108 activates a selected memory cell 102 by applying a specified voltage to the corresponding word line 104, and the demultiplexer 112 couples the bit line 106 corresponding to the selected memory cell 102 to the sense circuitry 114. The resulting current detected by the sense circuitry 114 indicates the state of the memory cell 102, for example, whether the memory cell 102 corresponds to a logical one or logical zero. The result of the read is then sent to the I/O pad 116 of the data storage device. As explained further below in reference to FIG. 4, the reading of a selected memory cell 102 can be affected by leakage currents generated in the memory cells 102 adjacent to the selected memory cell 102, which could lead to incorrect read results. In embodiments, each memory cell 102 includes a backward diode configured to reduce leakage currents from adjacent cells, thereby reducing the likelihood of obtaining incorrect results during the read. In this way, the backward diode serves as a select device that isolates the selected memory cell 102 from adjacent memory cells 102.

Figure 2:
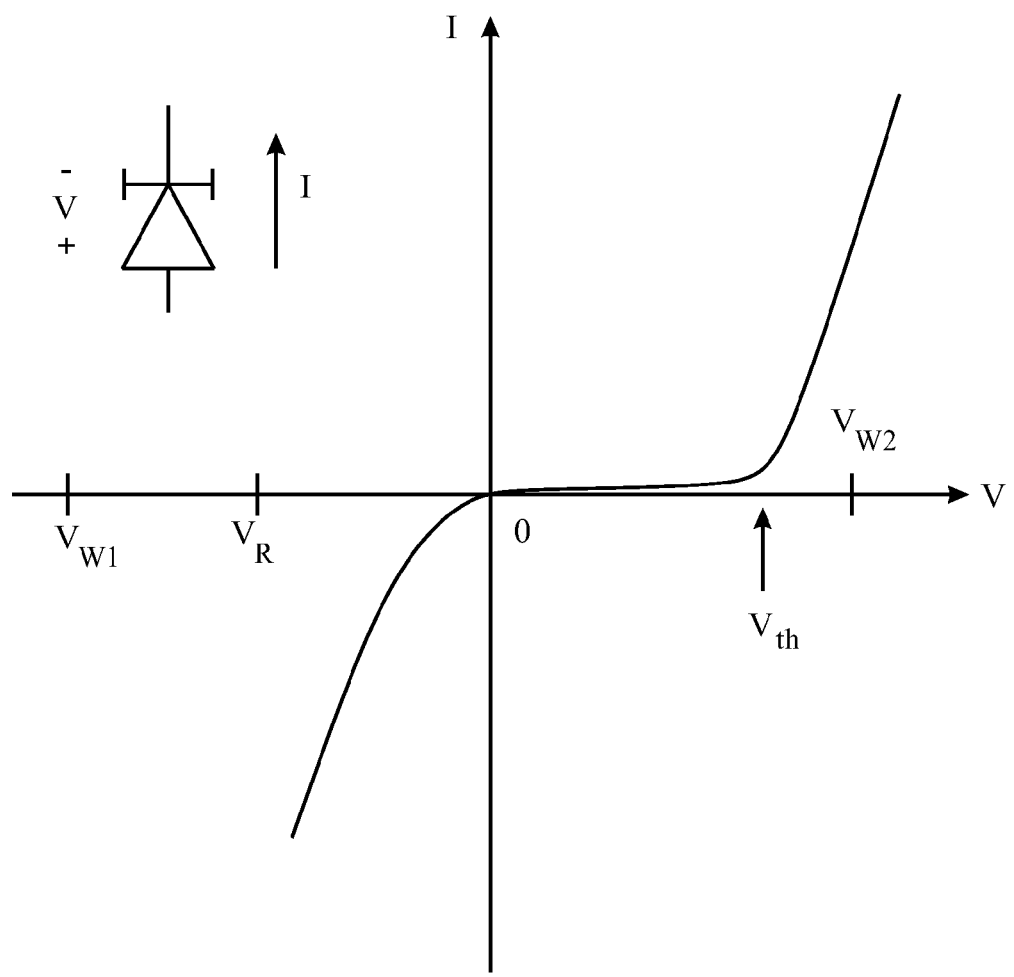
FIG. 2 is a current-voltage diagram of a backward diode in accordance with embodiments.

FIG. 2 is a current-voltage diagram of a backward diode in accordance with embodiments. The current-voltage diagram 200 shows the I-V characteristics of a backward diode under forward biased and reverse biased conditions. The term "backward diode" refers to a diode that exhibits better conduction properties for reverse biasing voltages compared to forward biasing voltages. For example, as shown in FIG. 2, when the backward diode is forward biased, the current through the backward diode exhibits the same characteristics as a typical Zener diode. In other words, below a voltage threshold, Vth, the current through the backward diode remains close to zero. The backward diode does not conduct a significant amount of current in the forward biased direction until the voltage exceeds the voltage threshold, Vth. However, when the backward diode is reverse biased, the backward diode begins to conduct almost immediately. In other words, for a small bias voltage, the backward diode conducts larger current in the reverse biased direction than in the forward biased direction. In embodiments, the threshold voltage, Vth, of the backward diode may be approximately 0.5-0.7 Volts if a silicon technology is used. The backward diode can be implemented using any suitable crystalline, polycrystalline, or amorphous semiconductor that can be amenable to standard fabrication processes such as doping. Suitable semiconductor materials may include silicon, gallium arsenide, and germanium, among others. For example, the backward diode can be implemented by silicon thin-film deposition on top of the Si CMOS (Complementary Metal-Oxide-Semiconductor) underlying circuitry. Further, the backward diode may be In embodiments, the backward diode's threshold voltage is less than the write voltage, and greater than half the write voltage. For example, the write voltage, Vw1, may be used to set the memory cell 102 to a resistance value that represents logical one, and the write voltage, Vw2, may be used to reset the memory cell 102 to a resistance value that represents logical zero. In the case of a silicon-based backward diode, for example, Vw1 may be approximately 1.0 to 2.0 volts and Vw2 may be approximately −0.5 to 1.5 volts. It will be appreciated that the voltages shown in FIG. 2 are not drawn to scale. The backward diode and the memory cell 102 will conduct current during both write operations. During a write of a selected memory cell, the voltage across adjacent memory cells will always be less than half of the write voltage minus the threshold voltage of the backward diode (i.e., less than Vw/2-Vth), which effectively isolates unselected memory cells. In other words, the backward diode allows relatively high current to pass through the selected memory cell 102, while inhibiting current flow in the reverse direction in neighboring memory cells 102.

During a read of the memory cell 102, the magnitude of the read voltage, VR, may be less than the voltage threshold of the backward diode, for example, approximately one half of the threshold voltage of the backward diode. In the case of a silicon-based backward diode, for example, the read voltage, VR, may be in a range from approximately 0.1 to 0.5 volts. Further, the voltage drop at the backward diode is negligible since it is reverse biased. Further, the voltage applied to the selected memory cell 102 will be a reverse biasing voltage that allows current through the backward diode from cathode to anode. By disposing a backward diode either before or after the memristor device in the memory cells 102, the voltage across adjacent, unselected memory cells will always be smaller than one half the read voltage minus the threshold voltage of the backward diode (i.e., less than VR/2-Vth), which effectively isolates unselected memory cells. In other words, the backward diode allows relatively high current to pass through the selected memory cell 102, while inhibiting current flow in the reverse direction in neighboring memory cells 102.

Figure 3:
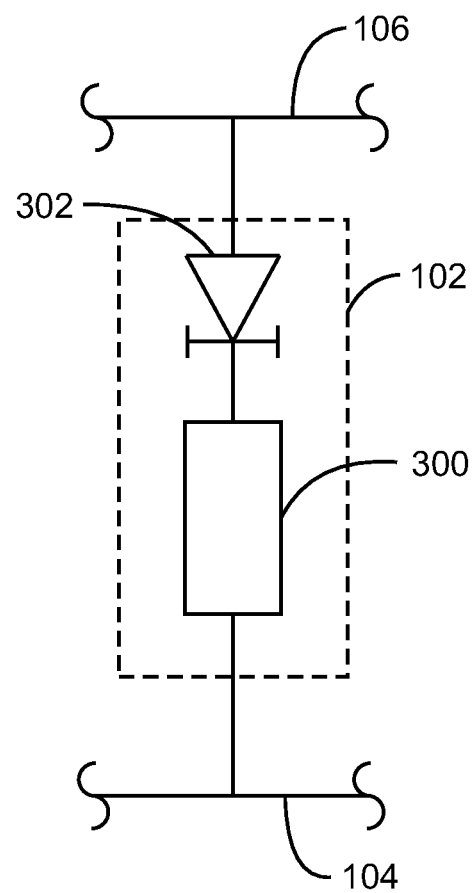
FIG. 3 is a circuit diagram of a memory cell in accordance with embodiments.

FIG. 3 is a circuit diagram of a memory cell in accordance with embodiments. As shown in FIG. 3, each memory cell 102 may include a memory element 300 and a backward diode 302 disposed between the corresponding word line 104 and the bit line 106 in series with the memory element 300. The memory element 300 may be a resistive memory element such as a memristor, a Phase Change Material resistor, a conductive bridge resistor, a transition metal oxide based resistor, or any embodiment of resistive changing memory. As used herein, the term resistive memory element refers to a memory element wherein the logical state of the memory element (e.g., whether it stores a one or a zero) is indicated by the resistance of the memory element. In resistive memory elements, the resistance exhibited by the memory element can be changed, for example, by passing current through the resistive memory element or subjecting the resistive memory element to a magnetic field.

The polarization of the backward diode 302 may be oriented such that the backward diode 302 of the selected memory cell 102 will be reverse biased during a read operation, while the backward diode 302 of at least some of the adjacent memory cells 102 will be forward biased at a voltage level less than the voltage threshold of the backward diode 302. In this way, during the read operation, the backward diode 302 enables current through the selected memory cell 102 while inhibiting leakage current through the adjacent cells. In embodiments, the backward diode 302 may be made of materials that can be deposited at low temperatures, such as amorphous silicon and microcrystalline silicon, among others. In this way, the backward diode 302 may be formed by disposing amorphous silicon, microcrystalline silicon, or some combination thereof, over the already formed memory element 300 without negatively affecting the memory element 300. The effect of disposing a backward diode 302 in series with each memory element 300 may be better understood with reference to FIG. 4.

Figure 4:
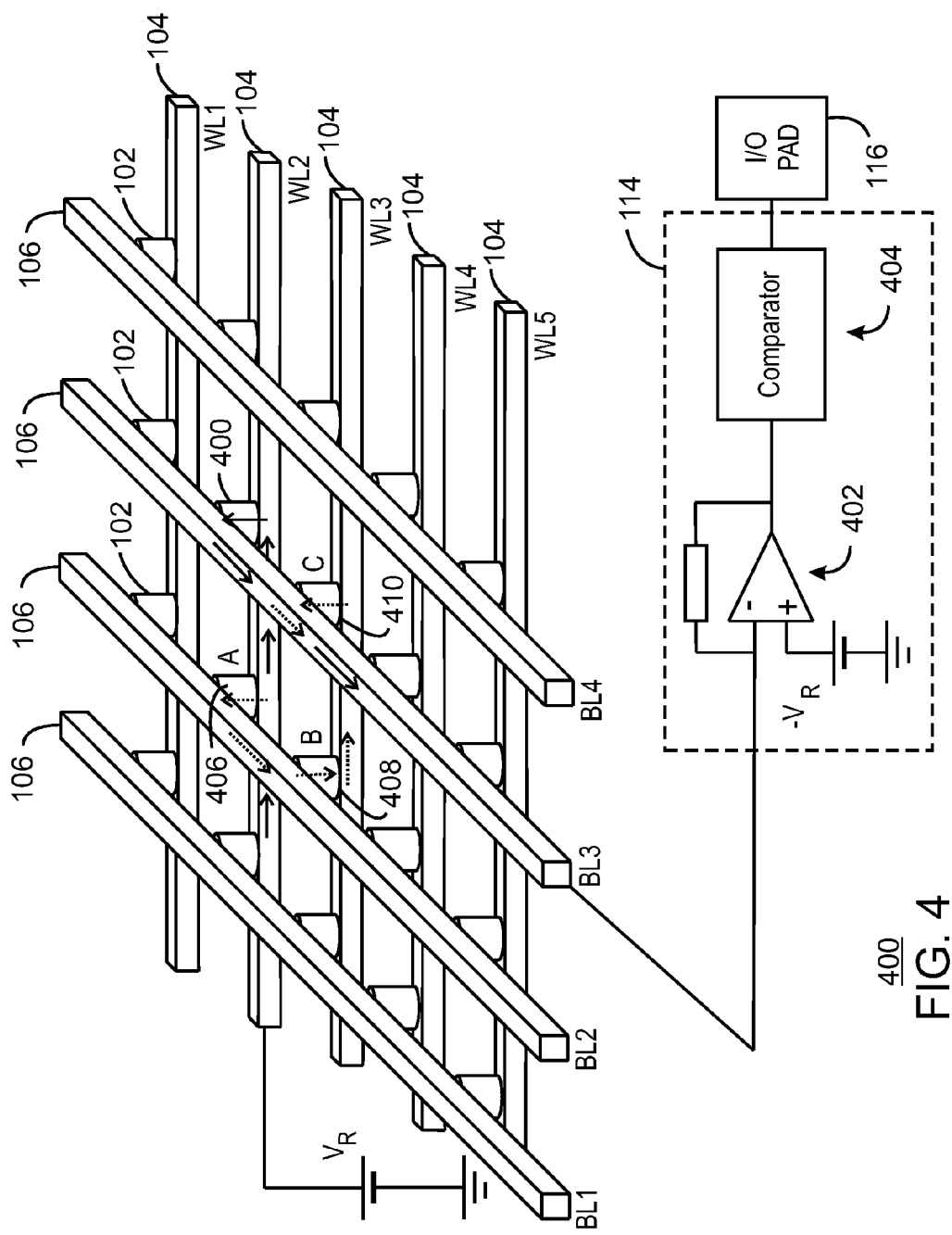
FIG. 4 is a perspective view of memory cell array showing a main current path and leakage current path during a read operation, in accordance with embodiments.

FIG. 4 is a perspective view of memory cell array showing a main current path and leakage current path during a read operation, in accordance with embodiments. As shown in FIG. 4, the memory cell array includes a matrix of memory cells 102 electrically coupled to word lines 104, labeled BL1-BL4, and bit lines 106, labeled WL1-WL5. Further, a selected memory cell 400 has been activated by the word line control circuitry 108 and the bit line control circuitry 110 to read the selected memory cell 400. The selected memory cell 400 is at the cross point of the word line WL2 and bit line BL3. As shown in FIG. 4, the selected memory cell 400 is read by applying a read voltage, VR, to the word line 104 of the selected memory cell 400 and coupling the bit line 106 of the selected memory cell 400 to the sense circuitry 114. The current measured for the selected memory cell 400 indicates the logical state of the selected memory cell 400, in other words, whether the selected memory cell 400 stores a logical one or zero. The sense circuitry 114 may include, as a non-limiting example of a sense amplifier, a current-to-voltage converter 402 coupled to the bit line 106 and a comparator 404 coupled to the output of the current-to-voltage converter 402. The output voltage of the current-to-voltage converter 402 is proportional to the current through the selected memory cell 400. The comparator 404 compares the output voltage of the current-to-voltage converter 402 to a threshold voltage to determine the logical state of the selected memory cell 400.

FIG. 4 also shows the current path through the memory cell array resulting from the voltage applied to the word line 104 of the selected memory cell 400. The main current path through the selected memory cell 102 is shown with the solid arrows. A path of the leakage current is shown by the dotted arrows and follows a path through three of the adjacent memory cells 102, referred to as memory cell A 406, memory cell B 408, and memory cell C 410. As shown by the dotted lines, the voltage on the word line 104 of the selected memory cell 400 tends to promote a leakage current that follows a path from the selected word line 104 through adjacent memory cell A 406 to the adjacent bit line 106, along the adjacent bit line 106 to memory cell B 408, through memory cell B 408 to the adjacent word line 104, along the adjacent word line 104 to adjacent memory cell C 410, and through memory cell C 410 to the selected bit line 106. Any leakage current following this path would add to the main current through the selected memory cell 400. Although a single leakage path is shown, it will be appreciated that similar leakage paths would exist for the other adjacent memory cells 102.

Based on the shown leakage path, it can be seen that the memory cell B 408, which is disposed at the cross point of the adjacent bit line 106 and the adjacent word line 104, will have an opposite voltage polarity compared to the selected memory cell 400. Thus, when the backward diode 302 (FIG. 3) of the selected memory cell 400 is reverse biased, the backward diode 302 of the adjacent memory cell B 408 will be forward biased. Further, the magnitude of the read voltage, VR, is less than the voltage threshold of each of the backward diodes 302. Accordingly, the backward diode 302 of memory cell B 408 effectively blocks significant current though the adjacent memory cell B and inhibits the leakage current. At the same time, the reverse biased backward diode 302 of the selected memory cell 400 allows current through the selected memory cell 400.

What is claimed is:

1. A memory cell, comprising:
    a resistive memory element disposed between a first conductor and a second conductor, the first conductor and the second conductor configured to activate the resistive memory element; and
    a backward diode disposed in series with the memory element between the memory element and either the first conductor or the second conductor, wherein the backward diode has a threshold voltage that is less than a write voltage of the resistive memory element, but is greater than half a write voltage of the resistive memory element.

2. The memory cell of claim 1, wherein the resistive memory element comprises at least one of a memristor, a Phase Change Material resistor, a conductive bridge resistor, and a transition metal oxide based resistor.

3. The memory cell of claim 1, wherein the resistive memory element is configured to be read by applying a voltage across the first conductor and the second conductor that reverse biases the backward diode and is less than a threshold voltage of the backward diode.

4. The memory cell of claim 1, wherein the resistive memory element is configured to be written by applying a voltage across the first conductor and the second conductor that is greater than a threshold voltage of the backward diode.

5. The memory cell of claim 1, wherein the backward diode comprises amorphous silicon, microcrystalline silicon, or a combination thereof.

6. A method of forming a memory cell, comprising:
    disposing a resistive memory element between two electrodes;
    disposing a backward diode in series with the resistive memory element between two electrodes, wherein the backward diode is configured to exhibit a threshold voltage less than a magnitude of a write voltage and greater than approximately one half of the magnitude of the write voltage.

7. The method of claim 6, wherein disposing the resistive memory element comprises forming a memristor.

8. The method of claim 6, wherein disposing the backward diode comprises forming a backward diode comprising amorphous silicon, microcrystalline silicon, or a combination thereof, over the resistive memory element.

\* \* \* \* \*